(12) United States Patent
Cheng

(10) Patent No.: US 11,646,357 B2
(45) Date of Patent: May 9, 2023

(54) METHOD FOR PREPARING A P-TYPE SEMICONDUCTOR STRUCTURE, ENHANCEMENT MODE DEVICE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 141 days.

(21) Appl. No.: 17/151,211

(22) Filed: Jan. 18, 2021

(65) Prior Publication Data

US 2021/0143264 A1 May 13, 2021

Related U.S. Application Data

(63) Continuation-in-part of application No. 16/441,586, filed on Jun. 14, 2019, now Pat. No. 10,916,445, (Continued)

(51) Int. Cl.
*H01L 29/66* (2006.01)
*H01L 21/324* (2006.01)
(Continued)

(52) U.S. Cl.
CPC .. *H01L 29/66462* (2013.01); *H01L 21/02458* (2013.01); *H01L 21/3245* (2013.01);
(Continued)

(58) Field of Classification Search
CPC .......... H01L 21/02458; H01L 21/0254; H01L 21/3245; H01L 29/0646; H01L 29/0653;
(Continued)

(56) References Cited

U.S. PATENT DOCUMENTS

2014/0264379 A1* 9/2014 Kub ...................... H01L 29/365
257/77
2015/0221760 A1 8/2015 Kub et al.
(Continued)

FOREIGN PATENT DOCUMENTS

JP H05183189 A 7/1993
JP H08186332 A 7/1996
TW 201709512 A 3/2017

*Primary Examiner* — Cheung Lee
(74) *Attorney, Agent, or Firm* — Westbridge IP LLC

(57) ABSTRACT

The present application provides a method for preparing a p-type semiconductor structure, an enhancement mode device and a method for manufacturing the same. The method for preparing a p-type semiconductor structure includes: preparing a p-type semiconductor layer; preparing a protective layer on the p-type semiconductor layer, in which the protective layer is made of AlN or AlGaN; and annealing the p-type semiconductor layer under protection of the protective layer, and at least one of the p-type semiconductor layer and the protective layer is formed by in-situ growth. In this way, the protective layer can protect the p-type semiconductor layer from volatilization and to form high-quality surface morphology in the subsequent high-temperature annealing treatment of the p-type semiconductor layer.

17 Claims, 7 Drawing Sheets

Related U.S. Application Data which is a continuation of application No. PCT/CN2017/099145, filed on Aug. 25, 2017.

(51) Int. Cl.
| | | |
|---|---|---|
| *H01L 29/778* | (2006.01) | |
| *H01L 29/43* | (2006.01) | |
| *H01L 21/02* | (2006.01) | |
| H01L 29/205 | (2006.01) | |
| H01L 29/06 | (2006.01) | |
| H01L 29/20 | (2006.01) | |
| H01L 29/207 | (2006.01) | |

(52) U.S. Cl.
CPC ........ *H01L 29/432* (2013.01); *H01L 29/7783* (2013.01); *H01L 29/7786* (2013.01); *H01L 29/0646* (2013.01); *H01L 29/0653* (2013.01); *H01L 29/2003* (2013.01); *H01L 29/205* (2013.01); *H01L 29/207* (2013.01)

(58) Field of Classification Search
CPC ............. H01L 29/1066; H01L 29/2003; H01L 29/205; H01L 29/207; H01L 29/432; H01L 29/66431; H01L 29/66462; H01L 29/778; H01L 29/7782; H01L 29/7783; H01L 29/7786; H01S 5/34333

See application file for complete search history.

(56) References Cited

U.S. PATENT DOCUMENTS

2016/0104816 A1\* 4/2016 An ...................... H01L 33/0075
257/101
2018/0286945 A1\* 10/2018 Oka .................... H01L 29/0623

\* cited by examiner

METHOD FOR PREPARING A P-TYPE SEMICONDUCTOR STRUCTURE, ENHANCEMENT MODE DEVICE AND METHOD FOR MANUFACTURING THE SAME

CROSS-REFERENCE TO ASSOCIATED APPLICATIONS

This application is a continuation-in-part of U.S. patent application Ser. No. 16/441,586, filed on Jun. 14, 2019, which is a continuation application of International Application No. PCT/CN2017/099145, filed on Aug. 25, 2017. All of the aforementioned applications are hereby incorporated by reference in their entireties.

TECHNICAL FIELD

The present application relates to the technical field of microelectronics, and in particular to a method for preparing a p-type semiconductor structure, an enhancement mode device and a method for manufacturing the same.

BACKGROUND

In the prior art, a high electron mobility transistor (HEMT) can be provided with a p-type semiconductor layer at a gate to deplete two-dimensional electron gas of a gate region, so that the HEMT may be used to manufacture an enhancement mode device, as shown in FIG. 1. FIG. 1 illustrates an example of the enhancement mode device, in which the enhancement mode device includes a substrate 10, a nucleation layer 11, a buffer layer 12, a channel layer 13, a barrier layer 14, a p-type semiconductor layer 31, a source 21, a drain 22 and a gate 23, and the two-dimensional electron gas (2DEG) under the gate 23 is depleted by the p-type semiconductor layer 31.

For such enhancement mode devices, the quality of the p-type semiconductor layer is the most critical link, in which a sufficiently high hole concentration is required to deplete the two-dimensional electron gas (2DEG) in the gate region, and a sufficiently high threshold voltage is ensured to avoid accidental opening of the device. Furthermore, a gate voltage needs to have a sufficiently high swing to achieve high-speed switching of the device.

In a process of implementing the present application, the inventors find that at least the following problems exist in the prior art.

It is relatively difficult to prepare high-quality wide-bandgap p-type semiconductor layers. First, an energy level is so deep that it is difficult to ionize, and other impurities are incorporated during a growth process so that the p-type cannot be formed. Therefore, secondary annealing is required, but an annealing process usually causes damage to surface morphology of the p-type semiconductor layer. Taking GaN material as an example, when p-type GaN material is achieved by doping GaN with Mg, the doping of Mg has a memory effect, and there are difficulties in control of Mg concentration. After the p-type GaN material is grown, since an H atom has a passivation effect on Mg, Mg—H bonds are formed, and holes cannot be grown. Therefore, the annealing needs to be performed in an atmosphere without hydrogen and at a temperature above 700° C. to break the Mg—H bonds and activate Mg atoms in the p-type GaN material. However, in a high-temperature annealing process, a surface of the p-type GaN is damaged, and deterioration of the surface morphology may lead to a plurality of defects, thereby causing electric leakage and pre-breakdown of the device, and having a reliability problem.

SUMMARY

The purposes of the present application are to provide a method for preparing a p-type semiconductor layer, an enhancement mode device and a method for manufacturing the same, which can improve morphological quality of the p-type semiconductor layer and performance of the enhancement mode device.

An embodiment of the present application discloses a method for preparing a p-type semiconductor structure, including the following steps: preparing a p-type semiconductor layer; preparing a protective layer on the p-type semiconductor layer, in which the protective layer is made of AlN or AlGaN; and annealing the p-type semiconductor layer under protection of the protective layer. At least one of the p-type semiconductor layer and the protective layer is formed by in-situ growth.

Preferably, the annealing the p-type semiconductor layer under protection of the protective layer includes: annealing the p-type semiconductor layer by in-situ annealing.

Preferably, the p-type semiconductor layer includes anyone or any combination of p-type GaN, p-type InGaN and p-type AlInGaN.

Preferably, the p-type semiconductor layer is doped with Mg.

Preferably, the protective layer is not doped; or the protective layer is one of p-type doped, n-type doped, and p-type and n-type co-doped, that is, the protective layer is p-type doped or n-type doped, or the protective layer is p-type and n-type co-doped.

Preferably, a preparation temperature of the protective layer is not higher than a preparation temperature of the p-type semiconductor layer.

An embodiment of the application also discloses an enhancement mode device, including: a substrate; a channel layer disposed on the substrate; a barrier layer disposed on the channel layer; a p-type semiconductor layer disposed on the channel layer; and a protective layer disposed on the p-type semiconductor layer. The protective layer is made of AlN or AlGaN. The p-type semiconductor layer is located between the barrier layer and the protective layer.

Preferably, the p-type semiconductor layer is formed by annealing and under protection of the protective layer, and at least one of the p-type semiconductor layer and the protective layer is formed by in-situ growth.

Preferably, the p-type semiconductor layer is annealed by in-situ annealing.

Preferably, the p-type semiconductor layer includes anyone or any combination of p-type GaN, p-type InGaN and p-type AlInGaN.

Preferably, the p-type semiconductor layer is doped with Mg.

Preferably, the protective layer is not doped; or the protective layer is one of p-type doped, n-type doped, and p-type and n-type co-doped, that is, the protective layer is p-type doped or n-type doped, or the protective layer is p-type and n-type co-doped.

Preferably, the enhancement mode device further includes: a thin film layer disposed between the barrier layer and the p-type semiconductor layer. The thin film layer is an insulating layer or an n-type semiconductor layer.

Preferably, the thin film layer includes a groove located at a gate region.

Preferably, the enhancement mode device further includes: a source and a drain, located on the channel layer; and a gate, located on the protective layer and between the source and the drain. The protective layer is located between the gate and the p-type semiconductor layer.

An embodiment of the application also discloses a method for manufacturing an enhancement mode device, the method includes the following steps: forming a channel layer on a substrate; forming a barrier layer on the channel layer; forming a p-type semiconductor layer on the barrier layer; forming a protective layer on the p-type semiconductor layer, in which the protective layer is made of AlN or AlGaN, the p-type semiconductor layer is located between the barrier layer and the protective layer; and annealing the p-type semiconductor layer under protection of the protective layer.

Preferably, at least one of the p-type semiconductor layer and the protective layer is formed by in-situ growth.

Preferably, the annealing the p-type semiconductor layer under protection of the protective layer includes: annealing the p-type semiconductor layer by in-situ annealing.

Preferably, the p-type semiconductor layer includes any-one or any combination of p-type GaN, p-type InGaN and p-type AlInGaN.

Preferably, the p-type semiconductor layer is doped with Mg.

Preferably, the protective layer is not doped; or the protective layer is one of p-type doped, n-type doped, and p-type and n-type co-doped, that is, the protective layer is p-type doped or n-type doped, or the protective layer is p-type and n-type co-doped.

Preferably, a preparation temperature of the protective layer is not higher than a preparation temperature of the p-type semiconductor layer.

Preferably, before the forming a p-type semiconductor layer on the barrier layer, a thin film layer is formed on the barrier layer, and the thin film layer is an insulating layer or an n-type semiconductor layer.

Preferably, forming a groove in the thin film layer. The groove is located at a gate region.

The method for preparing the p-type semiconductor structure, the enhancement mode device and the method for manufacturing the same in the above embodiments of the present application have beneficial effects that compared with a traditional enhancement mode device, the protective layer 32 is provided to protect the p-type semiconductor layer 31 from damage caused by annealing process and to improve the quality of surface morphology of the p-type semiconductor layer, thereby improving electric leakage and pre-breakdown of the device, and increasing reliability of the device. The protective layer retained in the device also plays a role in reducing electric leakage of the gate and increasing the device swing. In a case where the thin film layer 15 is an n-type semiconductor layer, etching the p-type semiconductor layer can be avoided, thereby simplifying the process flow greatly, and avoiding the effect of damage caused by etching on performance of the device.

BRIEF DESCRIPTION OF DRAWINGS

In order to more clearly illustrate the technical schemes of the embodiments of the present application, the accompanying drawings used in the embodiments will be briefly introduced below. It should be understood that the following accompanying drawings only show certain embodiments of the present application, and therefore the following accompanying drawings should not be regarded as a limitation on the scope. For those skilled in the art, other related accompanying drawings may also be obtained from these accompanying drawings without any creative effort.

DETAILED DESCRIPTION

In order to make purposes, technical schemes and advantages of the embodiments of the present application clearer, the technical schemes in the embodiments of the present application are clearly and completely described in the following with reference to the accompanying drawings in the embodiments of the present application. Obviously, the embodiments which are described are a part of the embodiments of the present application, and not all of the embodiments. Usually, components of the embodiments of the present application described and illustrated in the accompanying drawings herein may be arranged and designed in a variety of configurations.

Therefore, the following detailed description of the embodiments of the present application provided in the accompanying drawings is not intended to limit the scope of the present application which is required to protect, but merely intended to represent selected embodiments of the present application. Based on the embodiments of the present application, all other embodiments acquired by those skilled in the art without creative effort fall within the scope of protection of the present application.

In the description of the present application, it should be understood that an orientation or positional relationship indicated by the terms of upper, lower, left, right and so on is based on the orientation or the positional relationship shown in the accompanying drawings, the orientation or the positional relationship in which the inventive product is conventionally placed in use, or the orientation or the positional relationship that is conventionally understood by those skilled in the art, is merely for the purpose of describing the present application conveniently and simplifying the description, is not intended to indicate or imply that the device or component which is referred to must have a specific orientation and be constructed and operated in a specific orientation, and therefore cannot be understood as a limitation of the present application.

Referring to FIG. 2 to FIG. 6, FIG. 2 to FIG. 6 are schematic diagrams of manufacture process of an enhancement mode device in an embodiment of the present application.

Figure 1:
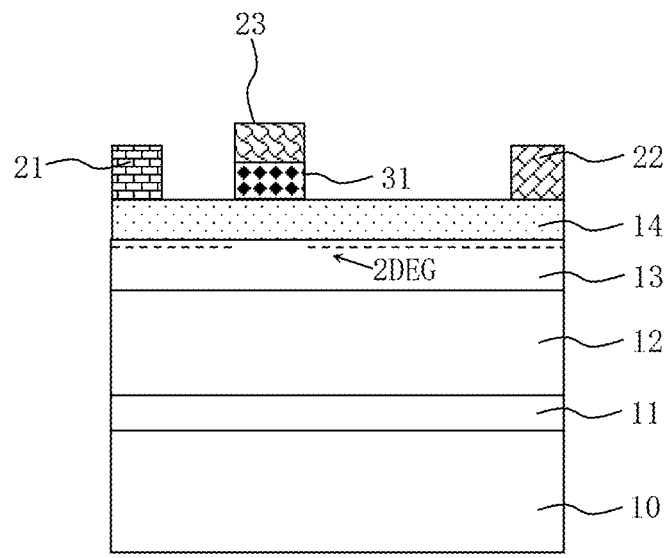
FIG. 1 is a schematic diagram of an embodiment of an enhancement mode device in the prior art.
Figure 2:
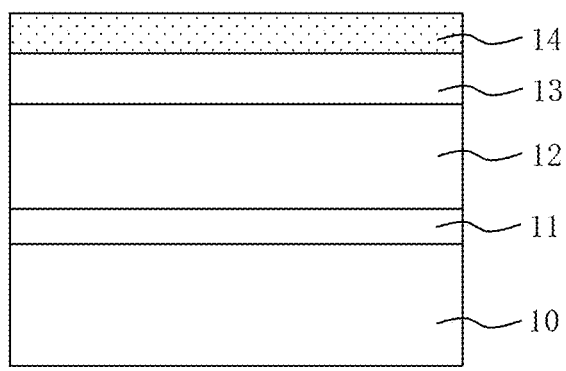
FIG. 2 to FIG. 6 are schematic diagrams of manufacture process of an enhancement mode device in an embodiment of the present application.

Step 1: referring to FIG. 2, a nucleation layer 11, a buffer layer 12, a channel layer 13 and a barrier layer 14 are sequentially grown on a substrate 10.

The substrate 10 is one or more materials preferably selected from sapphire, silicon carbide, silicon, lithium niobate, silicon-on-insulator (SOI), gallium nitride, or aluminum nitride. Materials of the nucleation layer 11, the buffer layer 12, the channel layer 13, and the barrier layer 14 may be any one of group III-V compounds, or any combination of group III-V nitrides.

The nucleation layer 11 and the buffer layer 12 may be determined according to a design requirement, for example, provided for improving the quality of a semiconductor layer grown above the substrate 10. Taking growing GaN above a silicon substrate as an example, a nucleation layer and a buffer layer are generally disposed to improve the subsequent growth quality of the GaN. The nucleation layer 11 may be, for example, AlN, the buffer layer 12 may be, for example, AlGaN, GaN, InGaN or the like, the channel layer 13 may be, for example, GaN, and the barrier layer 14 may be, for example, AlGaN. However, the present application is not limited to this, and the nucleation layer 11 and the buffer layer 12 are determined according to the materials of the substrate 10 and the channel layer 13. For example, GaN is grown above a gallium nitride substrate, the nucleation layer 11 and the buffer layer 12 may be omitted, or only one of the nucleation layer 11 and the buffer layer 12 may be disposed.

Figure 3:
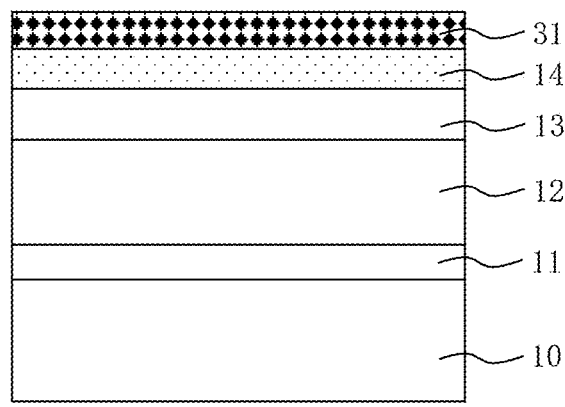

Step 2: referring to FIG. 3, a p-type semiconductor layer 31 is prepared on the channel layer 13.

For example, in this embodiment, the p-type semiconductor layer 31 may be formed by in-situ growth. In this way, dislocations generated during a formation process of the epitaxial layer are reduced, and the cost is reduced.

Material of the p-type semiconductor layer 31 may be one or more selected from p-type GaN, p-type InGaN and p-type AlInGaN. The p-type semiconductor layer 31 is preferably doped with Mg.

Figure 4:
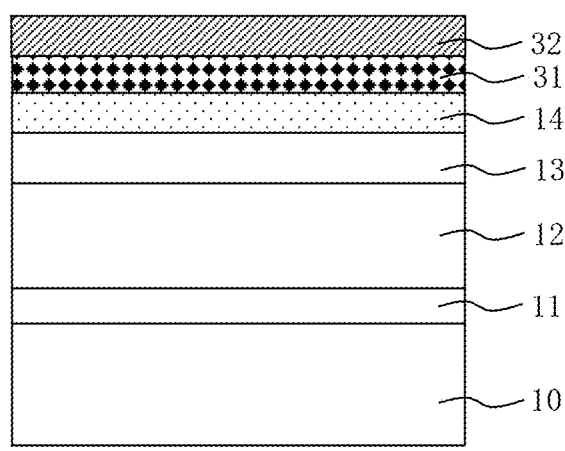

Step 3: referring to FIG. 4, a protective layer 32 is prepared on the p-type semiconductor layer 31, the p-type semiconductor layer 31 is formed between the barrier layer 14 and the protective layer 32, the protective layer 32 is AlN or AlGaN, and then the p-type semiconductor layer 31 is annealed.

For example, in this embodiment, the p-type semiconductor layer 31 is annealed by in-situ annealing. In this way, impurities can be reduced, and defects caused by handling the p-type semiconductor layer or the enhancement mode device can be reduced.

For example, in this embodiment, the protective layer 32 may be formed by in-situ growth. In this way, dislocations generated during a formation process of the epitaxial layer are further reduced, and the cost is further reduced.

In the above steps, the manufacture device may preferably be a Metal-organic Chemical Vapor Deposition (MOCVD) device, and may also be, for example, a Molecular Beam Epitaxy (MBE) device, an Atomic Layer Deposition (ALD) device or the like. Specific growth conditions may be determined according to a type of the material.

Preferably, a preparation temperature of the protective layer 32 is not higher than a growth temperature of the p-type semiconductor layer 31, so that the growth quality of the p-type GaN can be further improved.

In the present application, the protective layer can be doped or not doped. For example, the protective layer is p-type doped or n-type doped; or the protective layer is p-type and n-type co-doped.

In the present application, the p-type semiconductor layer 31 preferably being p-type GaN doped with Mg is taken as an example, and the protective layer 32 may preferably be AlN or AlGaN. After the protective layer 32 is prepared, the p-type semiconductor layer is annealed. In a case where the type semiconductor 31 is p-type GaN doped with the Mg preferably, annealing may be performed in an atmosphere without hydrogen and at a temperature above 700° C. The p-type semiconductor layer prepared by the present application has relatively good surface morphology.

Figure 5:
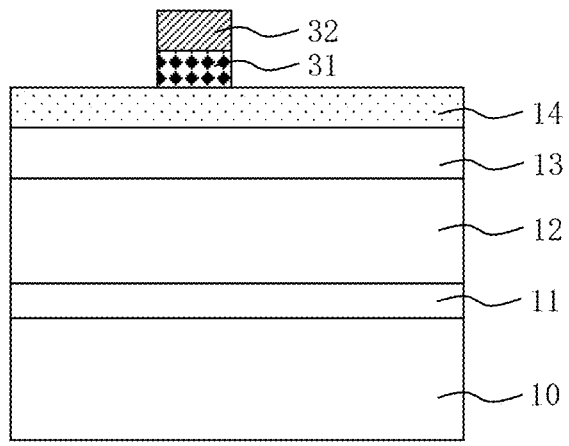

Step 4: referring to FIG. 5, the p-type semiconductor layer 31 and the protective layer 32 which are outside a gate region are etched.

For example, in the present application, the enhancement mode device may include a source, a drain and a gate. The source and the drain are located on the channel layer, the gate is located on the protective layer and between the source and the drain. The protective layer is located between the gate and the p-type semiconductor layer.

Figure 6:
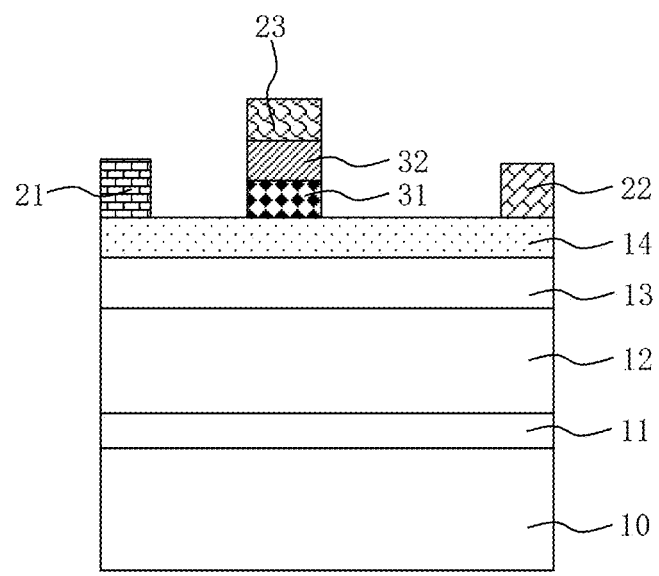

Step 5: referring to FIG. 6, a source 21, a drain 22, and a gate 23 are respectively prepared. The source 21 and the drain 22 are located on the channel layer 13, the gate 23 is located on the protective layer 32. Material of an electrode may be, for example, nickel, a nickel alloy, a metal oxide, a semiconductor or the like.

For example, in at least one embodiment of the present application, the source 21 and the drain 22 are formed on the barrier layer 14, that is, the barrier layer 14 is located between the channel layer 13 and each one of the source 21 and the drain 22.

For example, in the present application, the protective layer 32 is located between the source 21 and the drain 22.

Figure 12:
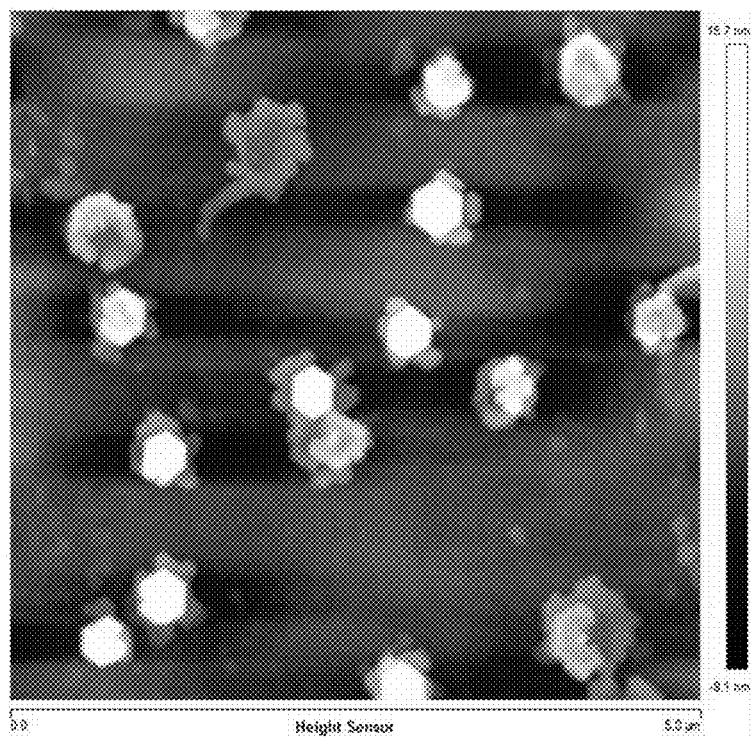
FIG. 12 is a surface morphology image of an annealed p-type semiconductor layer in the prior art under an atomic force microscope.
Figure 13:
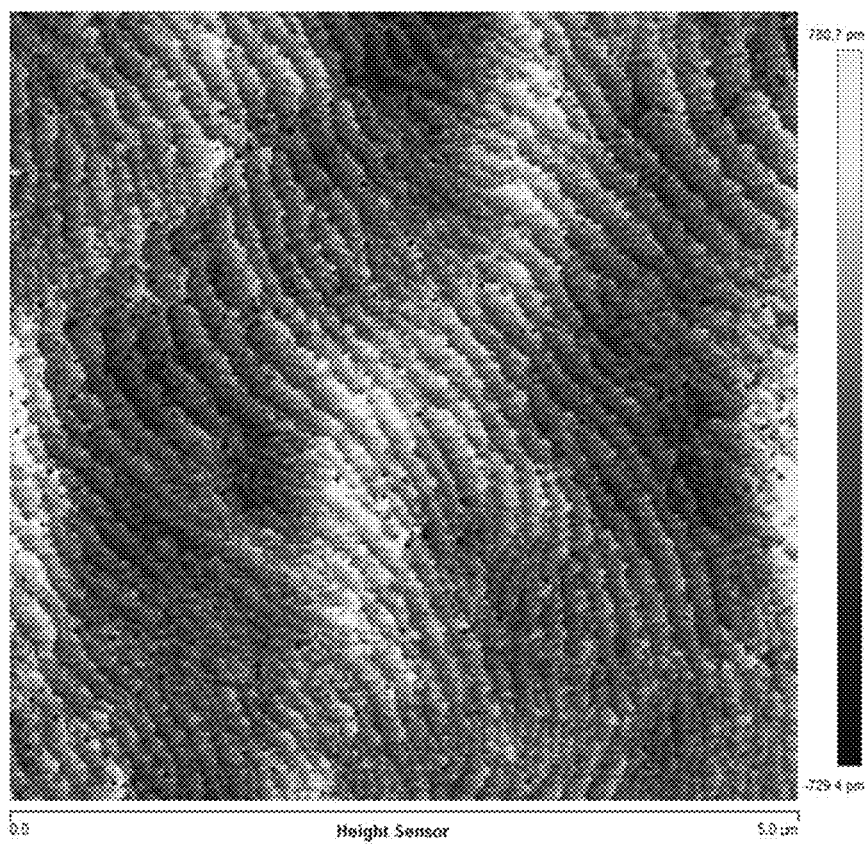
FIG. 13 is a surface morphology image of an annealed p-type semiconductor layer in the present application under an atomic force microscope.

Referring to FIGS. 12 and 13, FIG. 12 is a surface morphology image of an annealed p-type semiconductor layer in the prior art under an atomic force microscope, in which roughness of the surface morphology of the p-type semiconductor layer is about 4 nm. FIG. 13 is a surface morphology image of an annealed p-type semiconductor layer in the present application under an atomic force microscope, in which roughness of the surface morphology of the p-type semiconductor layer is less than 0.5 nm. The surface morphology of the p-type semiconductor layer is greatly improved by the present application.

The above embodiments of the present application have beneficial effects that the protective layer 32 better protects the p-type semiconductor layer 31 from damage caused by annealing process, and improves the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing.

Those skilled in the art should understand that the above steps may be adjusted to some extent according to the design of the enhancement mode device.

FIG. 7 to FIG. 10 are schematic diagrams of manufacture process of an enhancement mode device in another embodiment of the present application.

Figure 7:
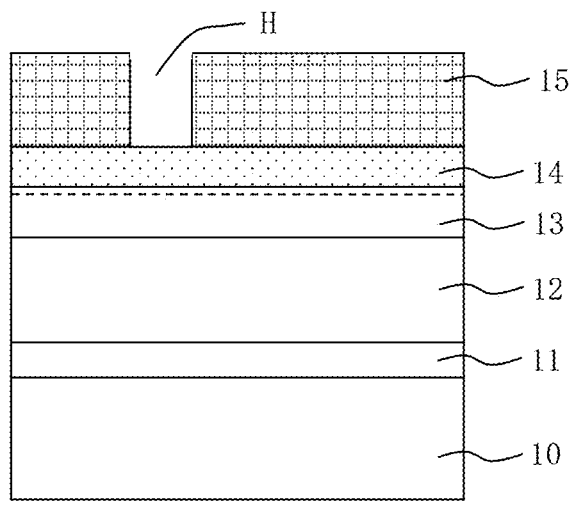
FIG. 7 to FIG. 10 are schematic diagrams of manufacture process of an enhancement mode device in an embodiment of the present application.

Step 1: referring to FIG. 7, a nucleation layer 11, a buffer layer 12, a channel layer 13, a barrier layer 14 and a thin film layer 15 are sequentially grown on a substrate 10. For example, in this embodiment, a groove H is etched in a gate region of the thin film layer 15. The groove H may preferably penetrate through the thin film layer 15. The groove H penetrating through the film layer 15 may make the device have the best working effect. However, if not penetrating through and only partially etched, the enhancement mode device can also be realized.

The groove H can make the p-type semiconductor layer 31 closer to the two-dimensional electron gas (2DEG), thereby reducing a turn-on voltage of the enhancement mode device.

The thin film layer 15 may be an insulating dielectric layer, which includes anyone or any combination of silicon nitride ($Si_3N_4$), silicon dioxide ($SiO_2$), aluminum nitride (AlN), aluminum nitride silicon ($SiAlN_x$), aluminum oxide ($Al_2O_3$), aluminum oxynitride (AlNO), hafnium oxide ($HfO_2$), silicon oxynitride ($Si_xO_yN_z$), and aluminum hafnium oxide (AlHfO).

For example, in the present application, the thin film layer 15 may be located between the source 21 and the drain 22.

Figure 8:
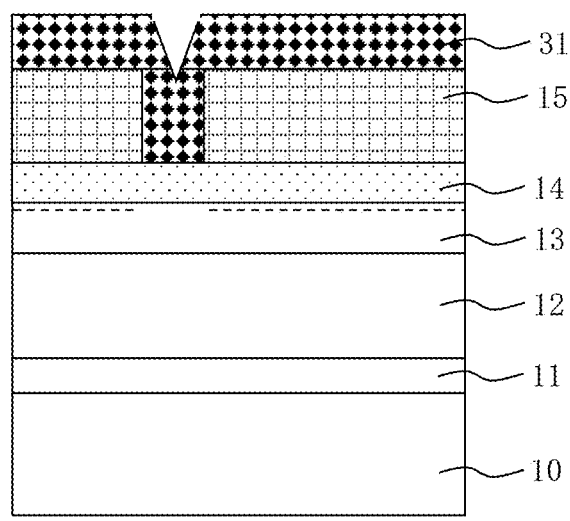

Step 2: referring to FIG. 8, a p-type semiconductor layer 31 is prepared on the thin film layer 15.

Figure 9:
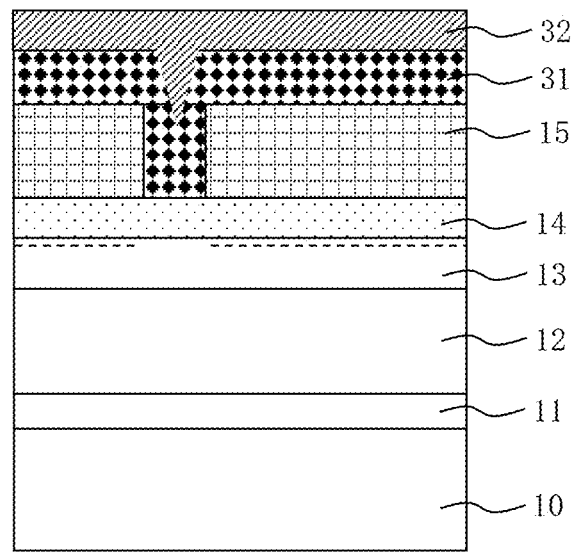

Step 3: referring to FIG. 9, a protective layer 32 is prepared on the p-type semiconductor layer 31. The protective layer 32 is made of AlN or AlGaN, and the protective layer 32 and the p-type semiconductor layer 31 may be prepared in a same device, that is, the protective layer 32 and the p-type semiconductor layer 31 are formed by in-situ growth.

Preferably, a preparation temperature of the protective layer 32 is not higher than a growth temperature of the p-type semiconductor layer 31, so that the growth quality of the p-type GaN may be further improved.

Figure 10:
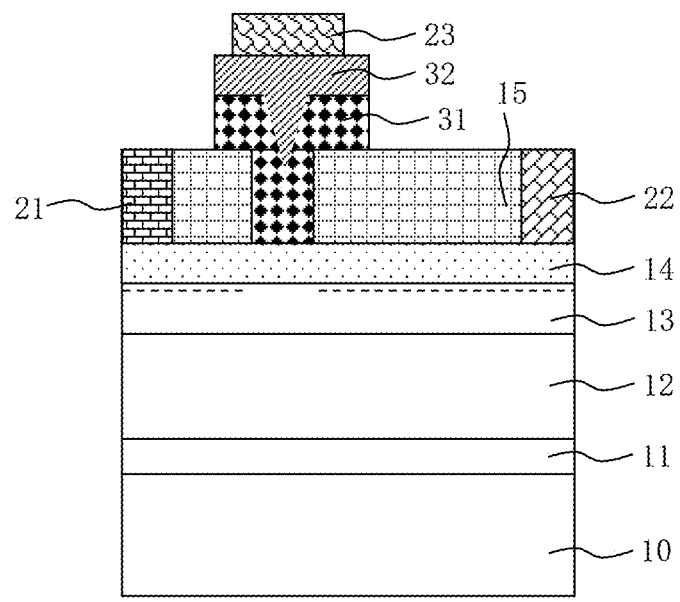

Step 4: referring to FIG. 10, the complete device structure is further manufactured according to a design requirement, and the p-type semiconductor layer 31 and the protective layer 32 which are outside the gate region may be removed.

Step 5: continuing to refer to FIG. 10, a source 21 and a drain 22 are respectively prepared on a source region and a drain region, and a gate 23 is prepared on the protective layer 32. The protective layer 32 may be further retained in the device structure to reduce electric leakage of the gate and increase the enhancement mode device swing.

The above embodiments of the present application have beneficial effects that the protective layer 32 is provided to protect the p-type semiconductor layer 31 from damage caused by annealing process and to improve the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing.

Those skilled in the art should understand that the above steps may be adjusted to some extent according to the design of the enhancement mode device.

Figure 11:
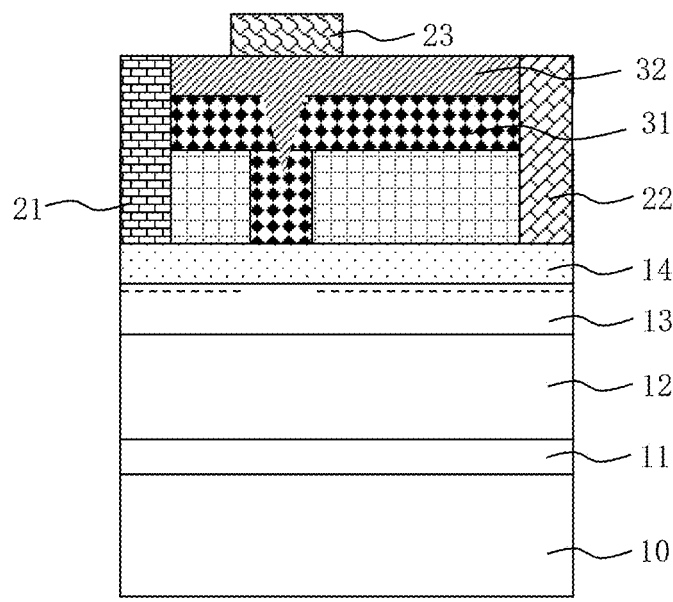
FIG. 11 is a schematic diagram of an enhancement mode device in another embodiment of the present application.

In still another embodiment of the present application, the thin film layer 15 in FIG. 7 to FIG. 10 may be an n-type semiconductor layer. Since the n-type semiconductor layer may perform electronic compensation on the channel layer, the source region and the drain region cannot be affected. The p-type semiconductor layer 31 and the protective layer 32 which are outside the gate region need not be etched first in step 4. The complete device structure is shown in FIG. 11. Selective etching of the p-type semiconductor layer is relatively difficult to control, and the etching is liable to cause damage to the device, however this embodiment can solve this problem properly.

The above embodiments of the present application have beneficial effects that the protective layer 32 is provided to protect the p-type semiconductor layer 31 from damage caused by annealing process and to improve the quality of the surface morphology of the p-type semiconductor layer, thereby improving electric leakage and pre-breakdown of the device, and increasing reliability of the device. The protective layer retained in the device also plays a role in reducing electric leakage of the gate and increasing the device swing. In a case where the thin film layer 15 is an n-type semiconductor layer, etching the p-type semiconductor layer can be avoided, thereby simplifying the process flow greatly, and avoiding the effect of damage caused by etching on performance of the device.

The above are only the preferred embodiments of the present application, and are not intended to limit the present application. For those skilled in the art, various modifications and changes may be made in the present application. Any modifications, equivalent substitutions, improvements, etc., made within the spirit and principle of the present application should be included within the scope of the present application.

What is claimed is:

1. A method for preparing a p-type semiconductor structure, comprising the following steps:
   preparing a p-type semiconductor layer;
   preparing a protective layer on the p-type semiconductor layer, the protective layer being made of AN or AlGaN; and
   annealing the p-type semiconductor layer under protection of the protective layer;
   wherein at least one of the p-type semiconductor layer and the protective layer is formed by in-situ growth, and the protective layer is one of p-type doped, n-type doped, and p-type and n-type co-doped.

2. The method of claim 1, wherein the annealing the p-type semiconductor layer under protection of the protective layer comprises:
   annealing the p-type semiconductor layer under protection of the protective layer by in-situ annealing.

3. The method of claim 1, wherein a preparation temperature of the protective layer is not higher than a preparation temperature of the p-type semiconductor layer.

4. A method for manufacturing an enhancement mode device, comprising the following steps:
   forming a channel layer on a substrate;
   forming a barrier layer on the channel layer;
   forming a p-type semiconductor layer on the barrier layer;
   forming a protective layer on the p-type semiconductor layer, the protective layer being made of AN or AlGaN, and the p-type semiconductor layer being formed between the barrier layer and the protective layer; and
   annealing the p-type semiconductor layer under protection of the protective layer;
   wherein at least one of the p-type semiconductor layer and the protective layer is formed by in-situ growth, and the protective layer is one of p-type doped, n-type doped, and p-type and n-type co-doped.

5. The method of claim 4, wherein the annealing the p-type semiconductor layer under protection of the protective layer comprises:
   annealing the p-type semiconductor layer under protection of the protective layer by in-situ annealing.

6. The method of claim 4, wherein the p-type semiconductor layer comprises anyone or any combination of p-type GaN, p-type InGaN and p-type AlInGaN.

7. The method of claim 4, wherein the p-type semiconductor layer is doped with Mg.

8. The method of claim 4, wherein a preparation temperature of the protective layer is not higher than a preparation temperature of the p-type semiconductor layer.

9. The method of claim 4, wherein a thin film layer is formed on the barrier layer before forming the p-type semiconductor layer on the barrier layer, and the thin film layer is one of an insulating layer and an n-type semiconductor layer.

10. The method of claim 9, further comprising the following steps:
    forming a groove in the thin film layer, the groove being located at a gate region.

11. An enhancement mode device, comprising:
    a substrate;
    a channel layer disposed on the substrate;
    a barrier layer disposed on the channel layer;
    a p-type semiconductor layer disposed on the channel layer; and
    a protective layer disposed on the p-type semiconductor layer, the protective layer being made of AN or AlGaN, and the p-type semiconductor layer being located between the barrier layer and the protective layer;
    wherein the p-type semiconductor layer is formed by annealing and under protection of the protective layer, at least one of the p-type semiconductor layer and the protective layer is formed by in-situ growth, and the protective layer is one of p-type doped, n-type doped, and p-type and n-type co-doped.

12. The enhancement mode device of claim 11, wherein the p-type semiconductor layer is annealed by in-situ annealing.

13. The enhancement mode device of claim 11, wherein the p-type semiconductor layer comprises anyone or any combination of p-type GaN, p-type InGaN and p-type AlInGaN.

14. The enhancement mode device of claim 11, further comprising:
    a thin film layer disposed between the barrier layer and the p-type semiconductor layer;
    wherein the thin film layer is one of an insulating layer and an n-type semiconductor layer.

15. The enhancement mode device of claim 14, wherein the thin film layer comprises a groove located at a gate region.

16. The enhancement mode device of claim 11, wherein a preparation temperature of the protective layer is not higher than a preparation temperature of the p-type semiconductor layer.

17. The enhancement mode device of claim 11, further comprising:
    a source and a drain, located on the channel layer; and
    a gate, located on the protective layer and between the source and the drain;
    wherein the protective layer is located between the gate and the p-type semiconductor layer.

* * * * *